(12) United States Patent
Liu

(10) Patent No.: US 10,236,883 B1
(45) Date of Patent: Mar. 19, 2019

(54) ALL-DIGITAL LOW VOLTAGE SWING CIRCUIT FOR INTRA-CHIP INTERCONNECTION

(71) Applicant: TAIWAN SEMICONDUCTOR MANUFACTURING COMPANY LTD., Hsinchu (TW)

(72) Inventor: Jack Liu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 35 days.

(21) Appl. No.: 15/684,561

(22) Filed: Aug. 23, 2017

(51) Int. Cl.
*H03K 19/00* (2006.01)
*H03K 19/0185* (2006.01)

(52) U.S. Cl.
CPC . *H03K 19/0013* (2013.01); *H03K 19/018528* (2013.01)

(58) Field of Classification Search
CPC ... G11C 7/1051; G11C 7/1057; G11C 7/1078; G11C 7/1084; G11C 7/1048; H03K 17/693; H03K 5/151; H03K 19/0008; H03K 19/00361; H03K 19/094; H03K 19/0963; H03K 19/0002; H03K 19/018521

USPC .............................. 326/21–24, 56–58, 82–92
See application file for complete search history.

(56) References Cited

U.S. PATENT DOCUMENTS

| | | | |
|---|---|---|---|
| 2002/0118042 A1* | 8/2002 | Helt | H03K 19/00384 326/86 |
| 2011/0215836 A1* | 9/2011 | Shimizu | H03K 19/094 326/83 |
| 2013/0002375 A1* | 1/2013 | Yang | H01L 23/5225 333/238 |

* cited by examiner

*Primary Examiner* — Seokjin Kim
(74) *Attorney, Agent, or Firm* — WPAT, P.C., Intellectual Property Attorneys; Anthony King

(57) ABSTRACT

A circuit includes a first driver unit and a second driver unit. The first driver unit is configured to generate a first output signal in response to a data signal and an enable signal, and drive the first output signal towards a power supply voltage, or towards a reference voltage, or hold the first output signal at a previous voltage level. The second driver unit is configured to generate a second output signal in response to the data signal and the enable signal, and drive the second output signal towards the power supply voltage, or towards the reference voltage, or hold the second output signal at a previous voltage level. The first output signal and the second output signal are complementary to each other.

17 Claims, 9 Drawing Sheets

ALL-DIGITAL LOW VOLTAGE SWING CIRCUIT FOR INTRA-CHIP INTERCONNECTION

BACKGROUND

As clock rate of circuits and systems increases year by year, power consumption has become an important consideration in modern circuit design. For example, power reduction on process technology, architecture design and circuit design has become increasingly popular in portable low-power electronic equipment such as smartphones, tablets and media players. Many analyses show that a larger quantity of power is dissipated for the communication, both inside and outside the chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
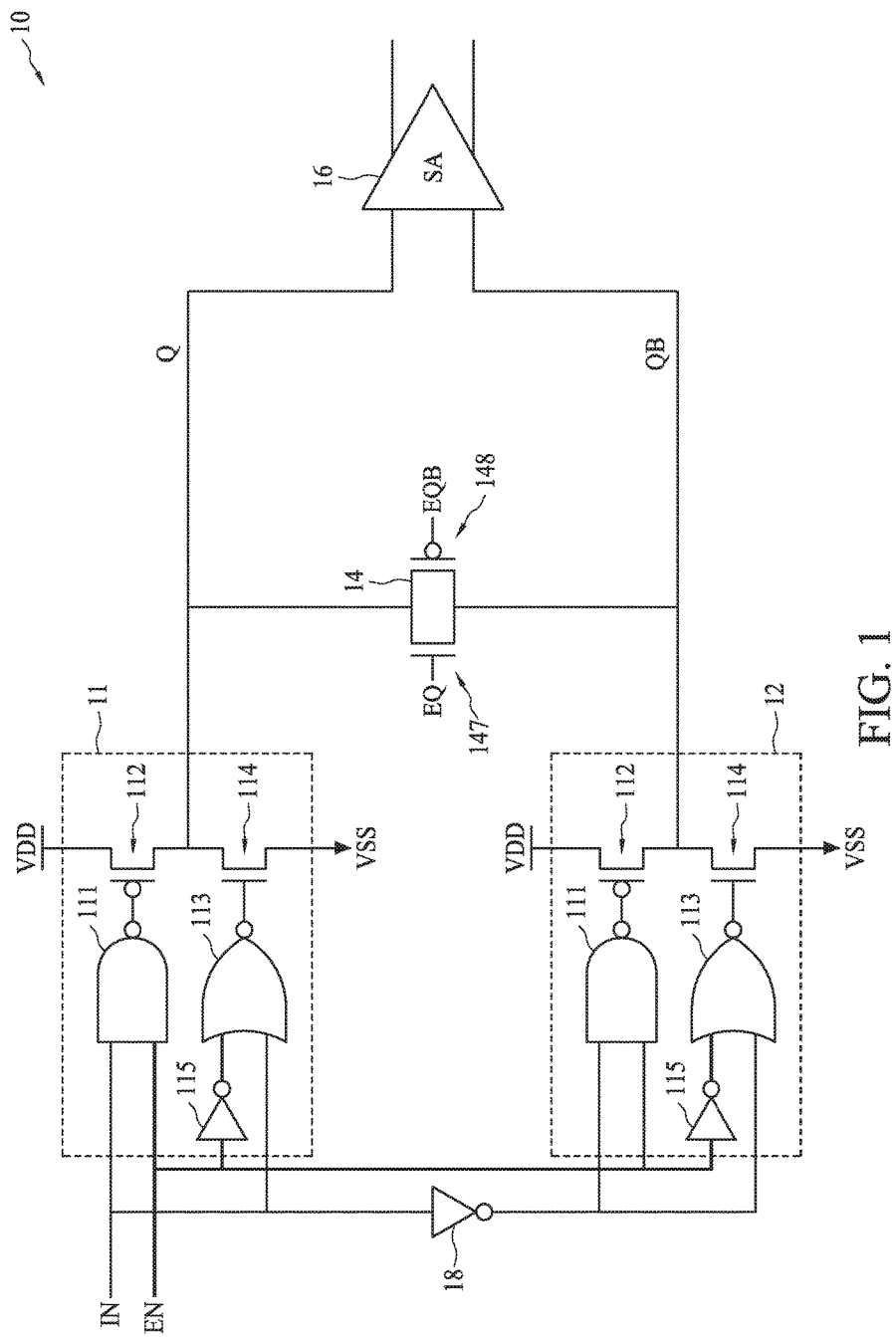
FIG. 1 is a circuit diagram of a circuit for interconnection, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a circuit diagram of a circuit 10 for interconnection, in accordance with some embodiments. Components of the circuit 10, which are used for intra-chip connection, may all operate in digital domain. Referring to FIG. 1, the circuit 10 includes a first driver unit 11, a second driver unit 12, an equalizer 14 and a sense amplifier 16.

The first driver unit 11 is configured to receive a first input signal and a second input signal, and generate a first output signal. In the present embodiment, the first input signal is a data signal IN, and the second input signal is an enable signal EN. In response to the first input signal IN and the second input signal EN, the first driver unit 11 generates the first output signal Q, and provides the same via, for example, a first wire such as a first bit line, to a first input of the sense amplifier 16. Moreover, the first driver unit 11 operates between a pair of power grids VDD and VSS, a power supply voltage and a reference voltage, respectively.

In the present embodiment, the first driver unit 11 includes a logic NAND gate 111 (hereinafter the "NAND gate"), a p-type metal-oxide-semiconductor (PMOS) transistor 112, a logic NOR gate 113 (hereinafter the "NOR gate"), an n-type metal-oxide-semiconductor (NMOS) transistor 114, and an inverter 115. A first input of the NAND gate 111 receives the first input signal IN. A second input of the NAND gate 111 receives the second input signal EN. An output of the NAND gate 111 is coupled to a gate terminal of the PMOS transistor 112. A source terminal of the PMOS transistor 112 receives VDD. A drain terminal of the PMOS transistor 112 is coupled via the first bit line to the first input of the sense amplifier 16. For brevity, the above-mentioned inputs, outputs and transistor terminals are not numbered.

In addition, a first input of the NOR gate 113 receives the first input signal IN. A second input of the NOR gate 113 receives the second input signal EN via the inverter 115. An output of the NOR gate 113 is coupled to a gate terminal of the NMOS transistor 114. A drain terminal of the NMOS transistor 114 is coupled to the drain terminal of the PMOS transistor 112 and in turn via the first bit line to the first input of the sense amplifier 16. A source terminal of the NMOS transistor 114 receives VSS. Since the omission does not hinder a person having ordinary skill in the art from understanding the circuit 10, the above-mentioned inputs, outputs and transistor terminals are not numbered for brevity.

In operation, as will be further discussed with reference to FIG. 2, the first driver unit 11 is configured to, in response to the input signals IN and EN, push a voltage level at the first output signal Q up to VDD, or pull a voltage level at the first output Q down to VSS, or hold the first output signal Q at its previous voltage state. As a result, the first driver unit 11 functions to serve as a differential push-pull tri-state driver.

The second driver unit 12 has substantially the same circuit structure as the first driver unit 11 except that, for example, the first input signal IN is received via the inverter 18. Specifically, the second driver unit 12 is configured to receive the first input signal IN via the inverter 18, receive the second input signal EN, and generate a second output signal QB. In response to the first input signal IN and the second input signal EN, the second driver unit 12 generates the second output signal QB, and provides the same via, for example, a second wire such as a second bit line, to a second input of the sense amplifier 16. The first output signal Q of the first driver unit 11 and the second output signal QB of the second driver unit 12 are complementary to each other in voltage level. For example, if the first output signal Q is logically high or has a high logic state, the second output signal QB is logically low or has a low logic state, and vice versa. Moreover, like the first driver unit 11, the second driver unit 12 operates between the pair of power grids VDD and VSS.

Also like the first driver unit 11, the second driver unit 12 includes a NAND gate 111, a PMOS transistor 112, a NOR gate 113, an NMOS transistor 114 and an inverter 115. In the second driver unit 12, a first input of the NAND gate 111 receives the first input signal IN via the inverter 18. A second input of the NAND gate 111 receives the second input signal EN. An output of the NAND gate 111 is coupled to a gate terminal of the PMOS transistor 112. A source terminal of the PMOS transistor 112 receives VDD. A drain terminal of the PMOS transistor 112 is coupled via the second bit line to the second input of the sense amplifier 16.

In addition, a first input of the NOR gate 113 receives the first input signal IN via the inverter 18. A second input of the NOR gate 113 receives the second input signal EN via the inverter 115. An output of the NOR gate 113 is coupled to a gate terminal of the NMOS transistor 114. A drain terminal of the NMOS transistor 114 is coupled to the drain terminal of the PMOS transistor 112 and in turn via the second bit line to the second input of the sense amplifier 16. A source terminal of the NMOS transistor 114 receives VSS.

In operation, as will be further discussed with reference to FIG. 2, the second driver unit 12 is configured to, in response to the input signals IN and EN, push a voltage level at the second output QB up to VDD, or pull a voltage level at the second output QB down to VSS, or hold the second output QB at its previous voltage state. As a result, the second driver unit 12 functions to serve as a differential push-pull tri-state driver.

The equalizer 14 is connected between the first bit line and the second bit line. Moreover, the equalizer 14 is configured to, in response to control signals EQ and EQB, determine whether to equalize the voltage levels of the first output signal Q and the second output signal QB. The control signals EQ and EQB are complementary to each other in voltage level. For example, if the control signal EQ is logically high or has a high logic state, the control signal EQB is logically low or has a low logic state, and vice versa.

In the present embodiment, the equalizer 14 includes an NMOS transistor 147 and a PMOS transistor 148. A gate terminal of the NMOS transistor 147 receives the control signal EQ. A drain terminal of the NMOS transistor 147 is coupled to the first bit line associated with first output signal Q. A source terminal of the NMOS transistor 147 is coupled to the second bit line associated with second output signal QB. Further, a gate terminal of the PMOS transistor 148 receives the control signal EQB. A source terminal of the PMOS transistor 148 is coupled to the first bit line associated with first output signal Q. A drain terminal of the PMOS transistor 148 is coupled to the second bit line associated with second output signal QB.

The sense amplifier 16, disposed at the end of the complementary bit lines associated with a cell, is configured to amplify a relatively small voltage associated with the first output signal Q or the second output signal QB from the cell to a normal logic level. The bit from the cell is then latched from the sense amplifier 16 into a buffer (not shown) and then put on an output bus (not shown).

Figure 2:
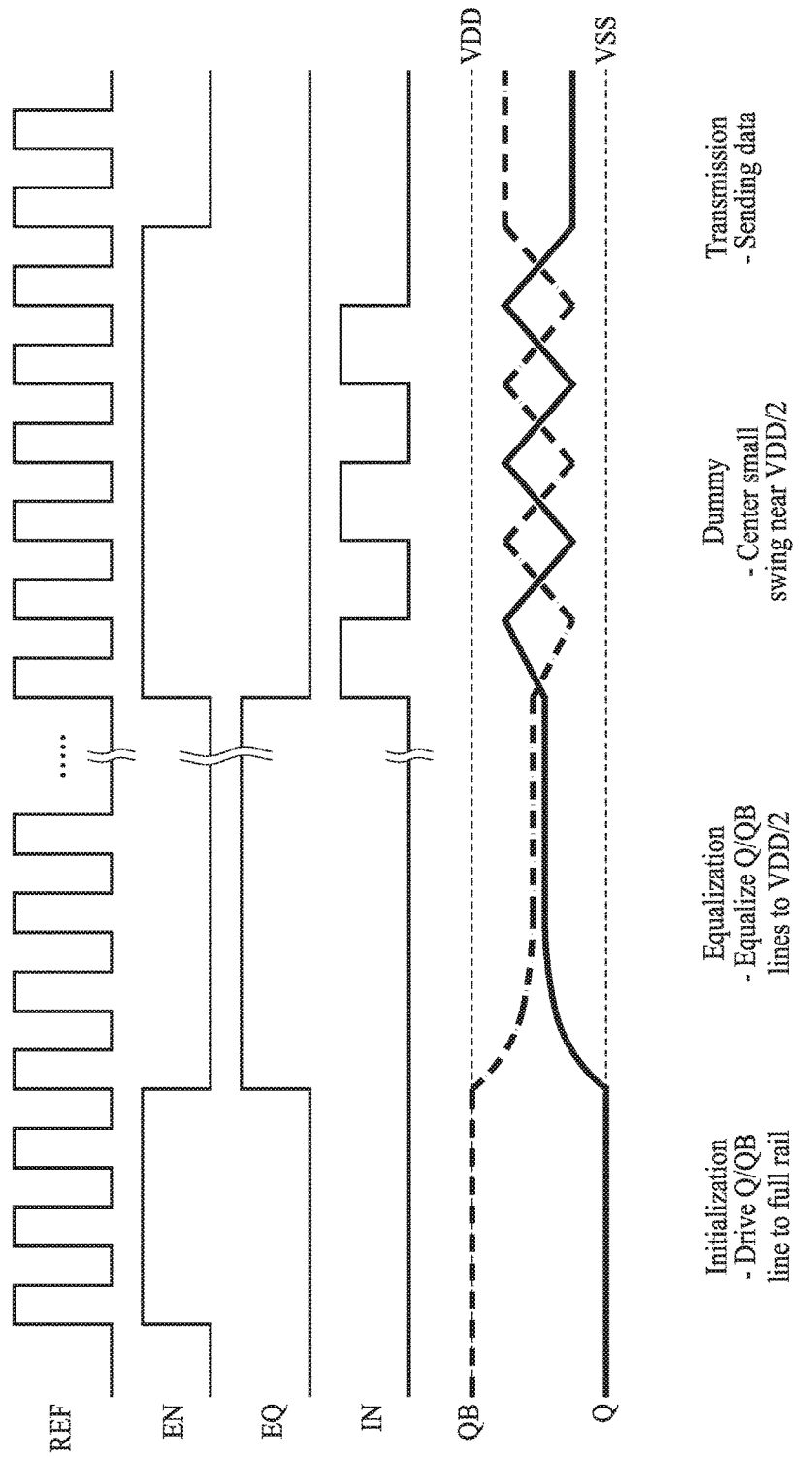
FIG. 2 is a timing diagram of signals for operation of the circuit illustrated in FIG. 1 in different phases, in accordance with some embodiments.

FIG. 2 is a timing diagram of signals for operation of the circuit 10 illustrated in FIG. 1 in different phases, in accordance with some embodiments.

Referring to FIG. 2, the circuit 10 operates in the following phases: initialization, equalization, dummy and transmission. At time t0, initialization is performed. The second input signal EN is activated (denoted as EN=1), the first input signal IN is logically low (IN=0) and the control signal EQ is kept deactivated (EQ=0). Assuming that initially the first output signal Q and the second output signal QB are logically low and logically high (Q=0 and QB=1), respectively, in response to EN=1 and IN=0, by function of the logic gates 111, 113 and 115, in the first driver unit 11 the PMOS transistor 112 is turned off and the NMOS transistor 114 is turned on. Moreover, since EQ=0 (and thus the complementary EQB=1), the equalizer 14 is turned off. As a result, the first output signal Q is pulled to logically low. Meanwhile, in response to EN=1 and IN=0, by function of the logic gates 111, 113, 115 and 18, in the second driver unit 12 the PMOS transistor 112 is turned off and the NMOS transistor 114 is turned on. As a result, the second output signal QB is pulled to logically high. During the initialization phase, the output signals Q and QB are driven to full-rail voltages, in the present embodiment, VSS and VDD, respectively. Initialization may be performed when a chip including the circuit 10 is powered on.

At time t1, equalization is performed. The second input signal EN is deactivated (denoted as EN=0), the first input signal IN is kept logically low, and the control signal EQ is activated (EQ=1). In response to EN=0 and IN=0, by function of the logic gates 111, 113 and 115, in the first driver unit 11 the PMOS transistor 112 and the NMOS transistor 114 are turned off. Moreover, since EQ=1 (and thus the complementary EQB=0), the equalizer 14 is turned on. As a result, the first output signal Q is pulled up to approximately a half of the power supply voltage, or ½ VDD. Meanwhile, in response to EN=0 and IN=0, by function of the logic gates 111, 113, 115 and 18, in the second driver unit 12 the PMOS transistor 112 and the NMOS transistor 114 are also turned off. Since the equalizer 14 is turned on, the second output signal QB is pulled down to approximately ½ VDD. As a result, during the equalization phase, the output signals Q and QB are equalized to approximately a half of the power supply voltage, ½ VDD.

At time t2, the data signal IN is inserted with a dummy cycle having alternating logic high (1) and logic low (0) values. The second input signal EN is activated (EN=1), and the control signal EQ is deactivated (EQ=0). Since EQ=0, the equalizer 14 is turned off and no equalization is performed.

When IN=1, by function of the logic gates 111, 113 and 115, in the first driver unit 11 the PMOS transistor 112 is turned on and the NMOS transistor 114 is turned off. As a result, the first output signal Q is pulled towards logically high. Meanwhile, in response to EN=1 and IN=1, by function of the logic gates 111, 113, 115 and 18, in the second driver unit 12 the PMOS transistor 112 is turned off and the NMOS transistor 114 is turned on. As a result, the second output signal QB is pulled towards logically low.

When IN=0, in the first driver unit 11 the PMOS transistor 112 is turned off and the NMOS transistor 114 is turned on. As a result, the first output signal Q is pulled towards logically low. Meanwhile, in response to EN=1 and IN=0, in the second driver unit 12 the PMOS transistor 112 is turned on and the NMOS transistor 114 is turned off. As a result, the second output signal QB is pulled towards logically high.

In the present embodiment, since the dummy cycle is composed of clock signals having a relatively short pulse width, when the first output signal Q and the second output signal QB are pulled towards logically high or low, they are not pulled to VDD or VSS, respectively. In some embodiments, the output signals Q and QB alternate with each other with respect to ½ VDD in a relatively small swing. The swing may be initially large and then stabilized to a smaller level after several cycles. Consequently, during the dummy phase, the first output signal Q and the second output signal QB swing near a half of the power supply voltage, ½ VDD.

At time t3, the second control signal EN stays activated (EN=1) and the control signal EQ stays deactivated (EQ=0). In response to a logically low data input IN=0, the first control signal Q is also logically low (Q=0) while the second output signal QB is logically high (QB=1). In contrast, in response to a logically high data input IN=1, the first control signal Q is also logically high (Q=1) while the second output signal QB is logically low (QB=0). As a result, during the transmission phase, data input IN is sent towards the sense amplifier 16.

In some existing approaches, low voltage swing circuits may employ multiple voltage sources, which may suffer area penalty or power penalty. For example, in a multi-VDD circuit, gate-to-source voltage (Vgs) head room reduction is likely to cause performance degradation. Moreover, multiple power sources inevitably require voltage regulators and a more complicated power grid routing, which results in additional area cost and power cost. Alternatively, some may be designed with dynamic circuits, which may suffer power penalty and throughput penalty. For example, a dynamic circuit may keep toggling even when data is not changed, which thus is not efficient in power management. In addition, to compensate for a relatively small drain-to-source voltage (Vds) allowed for equalization, a large-size equalization device may be required or additional time for equalization is needed in a dynamic circuit, which adversely affects the performance of the circuit. Also, performance degradation may in turn impact time division multiplexing, which undesirably limits wiring capacity.

Figure 3:
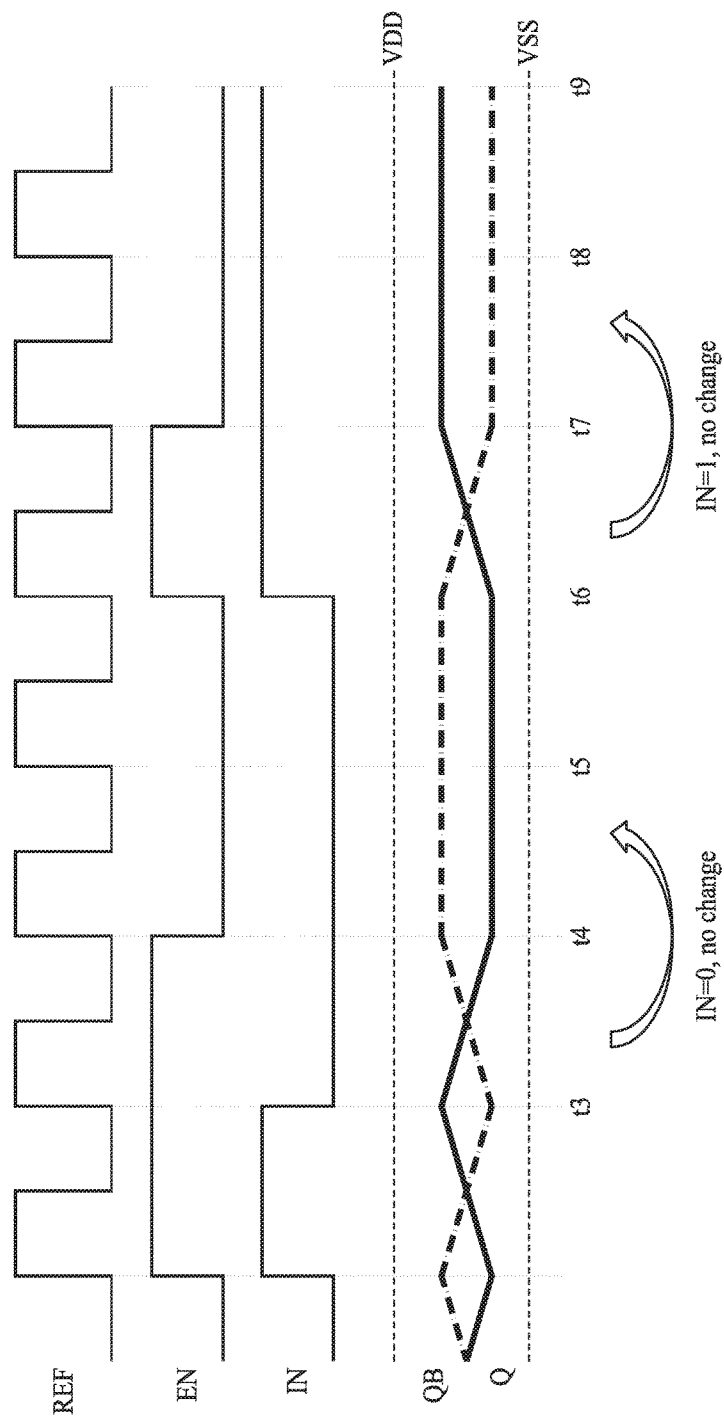
FIG. 3 is a timing diagram of signals for operation of the circuit illustrated in FIG. 1 in a data holding mode, in accordance with some embodiments.

FIG. 3 is a timing diagram of signals for operation of the circuit 10 illustrated in FIG. 1 in a data holding mode, in accordance with some embodiments.

Referring to FIG. 3, in a transmission phase that begins at time t3, as previously discussed, the second input signal EN stays activated to facilitate data transmission. The second input signal EN may be kept at an activated state during the transmission phase. In the present embodiment, however, the second input signal EN is deactivated when it is determined that the input data IN in the current cycle has a same value as that in the immediately previous cycle. For example, the data input IN is logically low (IN=0) during a first cycle between time t3 and t4, and is still logically low during a second cycle between time t4 and t5 immediately following the first cycle. In that case, since the data input IN is kept logically low, the second input signal EN that stays activated in the first cycle is deactivated in the second cycle. As a result, in response to EN=0 in the second cycle, all the PMOS transistors 112 and NMOS transistors 114 are turned off and, in response to IN=0 as in the present scenario, the first output signal Q in the second cycle is held at a same logical low value as in the first cycle. The second control signal EN is still kept at a deactivated state during a third cycle between time t5 and t6 immediately following the second cycle in response to an unchanged data input IN=0 in the third cycle. Deactivation of the second input signal EN facilitates power reduction, as compared to the case that EN stays activated throughout the whole data transmission phase. The second control signal EN is not activated until at time t6 the input data is changed to a logically high state.

As another example, the data input IN is logically high (IN=1) during a fourth cycle between time t6 and t7, and is still logically high during a fifth cycle between time t7 and t8 immediately following the fourth cycle. In that case, since the data input IN is kept logically high, the second input signal EN that is activated in the fourth cycle is deactivated in the fifth cycle. As a result, in response to EN=0 in the fifth cycle, all the PMOS transistors 112 and NMOS transistors 114 are turned off and, in response to IN=1 as in the present scenario, the first output signal Q in the fifth cycle is held at a same logical high value as in the fourth cycle. Likewise, the second control signal EN is still kept at a deactivated state during a sixth cycle between time t8 and t9 immediately following the fifth cycle in response to an unchanged data input IN=1 in the sixth cycle.

Figure 4:
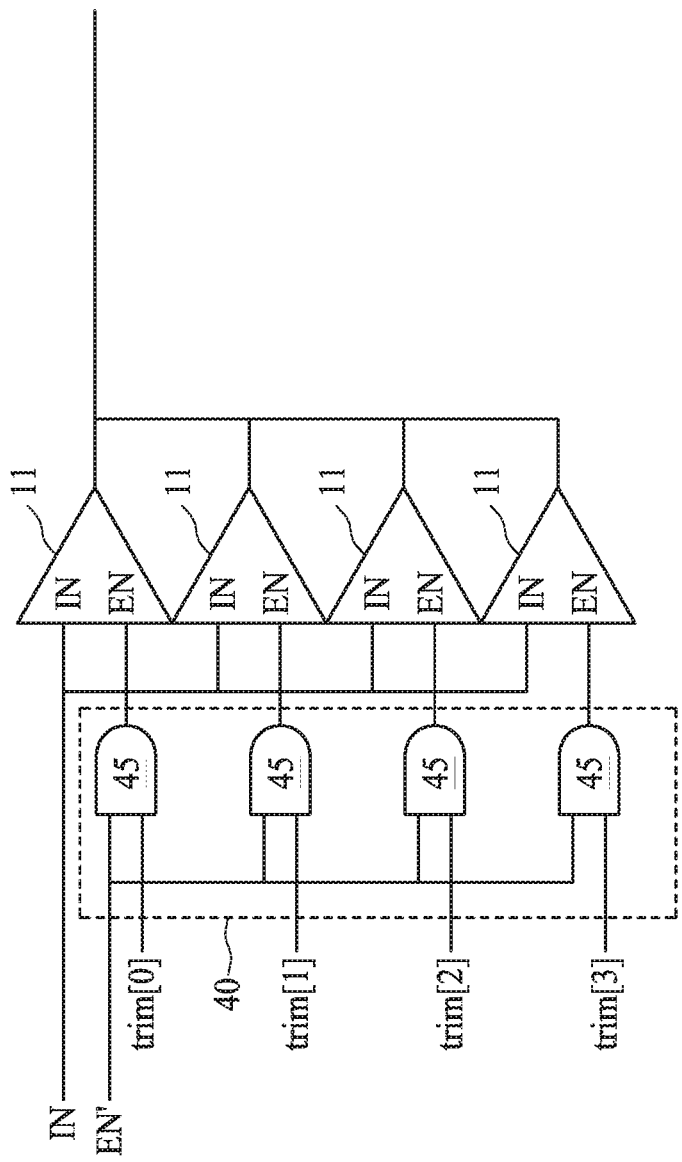
FIG. 4 is a diagram of an exemplary circuit for trimming driver units illustrated in FIG. 1.

FIG. 4 is a diagram of an exemplary circuit 40 for trimming driver units 11 and 12 illustrated in FIG. 1, in accordance with some embodiments.

Referring to FIG. 4, the circuit 40 includes logic gates such as AND gates 45 for trimming first driver units 11 and second driver units 12. For brevity, only first driver units 11 and only four of them are shown. The driver units 11 may suffer voltage deviation due to process variation such as in the case of an SS or FF corner. Each of the AND gates 45 includes a first input to receive an enable signal EN', and a second input to receive a trim signal trim[0], trim[1], trim[2] or trim[3]. In operation, a logically low trim signal can reduce the voltage deviation in an associated driver unit.

Figure 5:
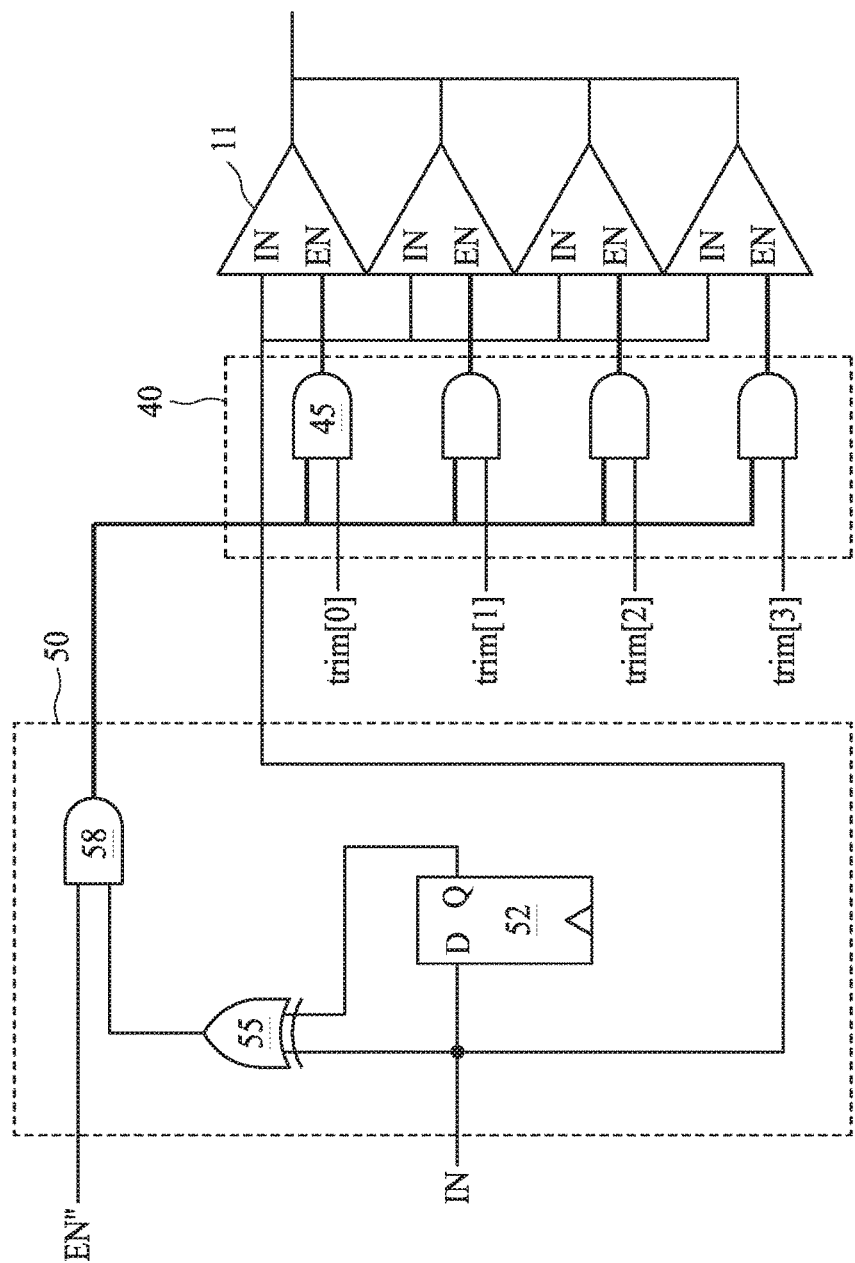
FIG. 5 is a circuit diagram of a controller for power management of the circuit illustrated in FIG. 1, in accordance with some embodiments.

FIG. 5 is a circuit diagram of a controller 50 for power management of the circuit 10 illustrated in FIG. 1, in accordance with some embodiments.

Referring to FIG. 5, the controller 50 is configured to determine if a first input data and a second input data immediately following the first input data have a same logic value. If affirmative, regardless of an input enable signal EN", a deactivated second control signal EN to provide to a driver unit 11 is generated (EN=0). If not, a second control signal EN is generated in accordance with the logic state of the input enable signal EN". In the present embodiment, the controller 50 includes a D-type flip flop (DFF) 52, an exclusive-or (XOR) gate 55 and a logic AND gate 58. An input of the DFF 52 receives data IN. An input of the XOR gate 55 also receives the data IN, and another input of the XOR gate 55 receives an output from the DFF 52. Further, an input of the AND gate 58 receives the enable signal EN", and another input of the AND gate 58 receives an output from the XOR gate 55. An output of the AND gate 58 provides the second control signal EN. In some embodiments, as illustrated, the second control signal EN is provided to the driver unit 11 via a trimming circuit 40. In other embodiments, the second control signal EN is directed provided to the driver unit 11.

In operation, for example, if an input data IN received by the DFF 52 at a first clock is logically low, the DFF 52 generates a logically low output in response to, for example, a rising edge of a second clock immediately following the first clock. Meanwhile, if the input data IN received at the second clock is also logically low, since an XOR gate outputs a high logical value only when inputs differ, the XOR gate 55 outputs a logically low value at the second clock in response to the same logic state of Q output (Q=0) and input data IN=0. As a result, by function of the AND gate 58, the second control signal EN is deactivated.

Figure 6:
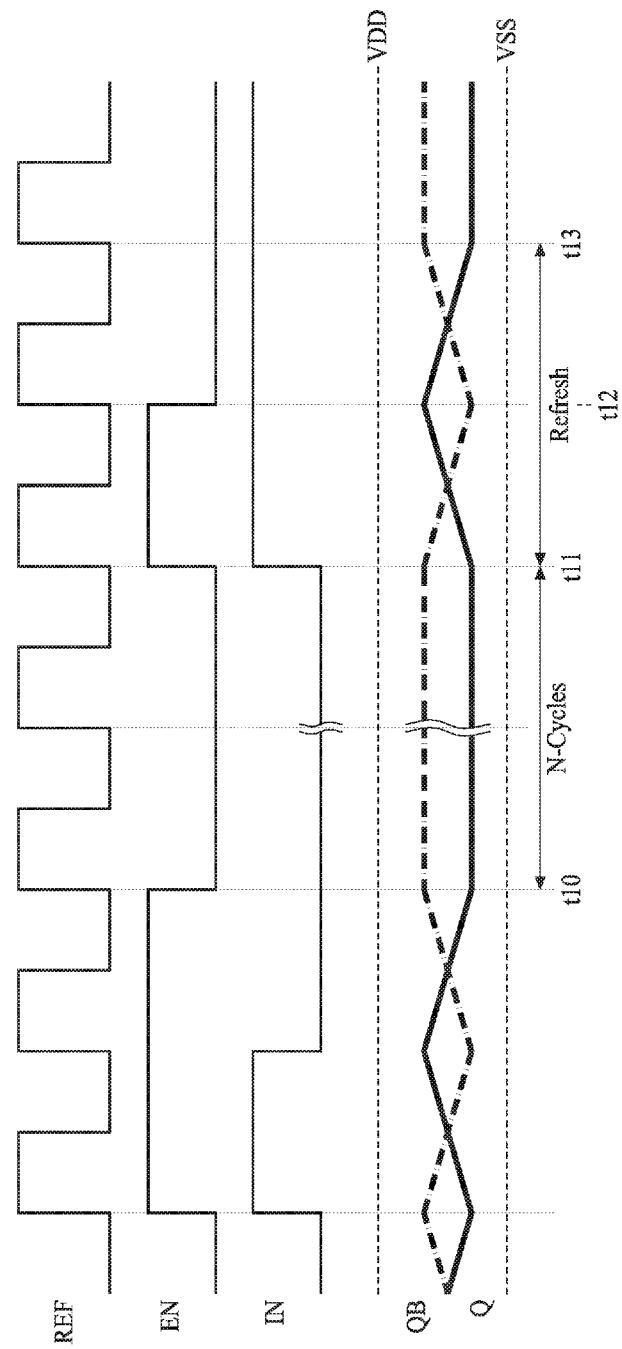
FIG. 6 is a timing diagram of signals for operation of the circuit illustrated in FIG. 1 in a refresh mode, in accordance with some embodiments.

FIG. 6 is a timing diagram of signals for operation of the circuit 10 illustrated in FIG. 1 in a refresh mode, in accordance with some embodiments.

Referring to FIG. 6, if data input IN during a transmission phase is kept at a same logic state for a relatively long period of time, the output Q or QB may be floating and may be subject to data corruption due to transistor leakage or coupling from other signals. In an embodiment, to prevent the output nodes from floating or corruption, the outputs Q and QB are refreshed every N cycle, N being a natural number. N is a predetermined number and may be determined by the time it takes for the noise margin of the bit line associated with Q or QB to degrade to an unacceptable level. For example, N may range from 100 to 1,000. Moreover, refresh is done by driving the data input IN to an inverted state followed by its original state. In the present embodiment, N cycles of Q=0 data is held during a period from time t10 to t11, where the enable signal EN is kept deactivated. At time t11, by activating the enable signal EN (EN=1) and sending a logically high data input IN (IN=0), the first output signal Q is pulled high (Q=1). Subsequently, at time t12, by deactivating the enable signal EN (EN=0) and resuming the data input IN to its original logically low state, the first output Q is pulled low (Q=0). The refresh operation from time t11 to time t13 does not adversely affect data integrity.

Figure 7A:
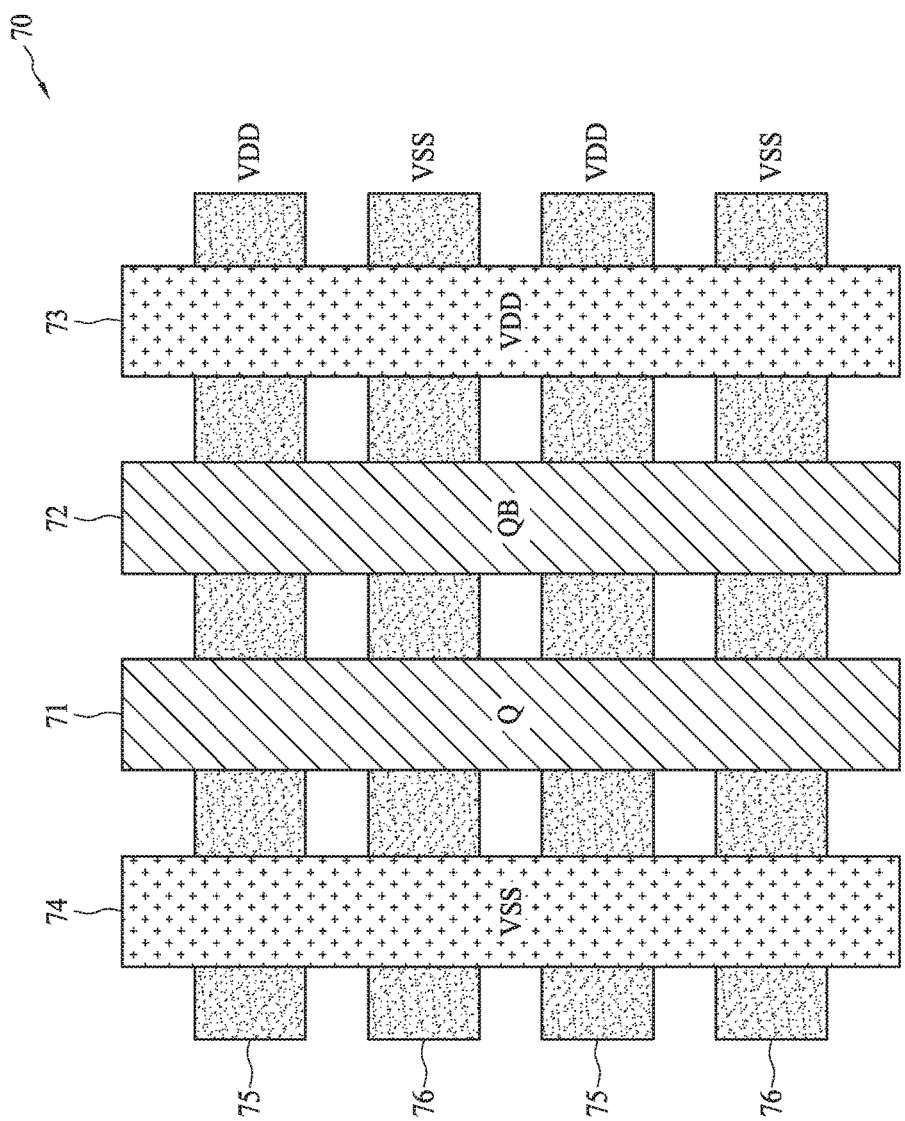
FIG. 7A is a schematic diagram of an exemplary layout according to a full-shielding mechanism.

FIG. 7A is a schematic diagram of an exemplary layout 70 according to a full-shielding mechanism.

Referring to FIG. 7A, in the layout 70, a first wire 71 for transmitting the first output signal Q and a second wire 72 for transmitting the second output signal QB are provided. The first wire 71 and the second wire 72 may be arranged between a pair of power rails 73 and 74 disposed on the same layer as the first and second wires 71 and 72. In addition. The first wire 71 and the second wire 72 may be arranged over (as illustrated in the present embodiment) or under (not shown) other pairs of power rails 75 and 76 disposed at a different layer from the first and second wires 71 and 72. In the full-shielding mechanism, the first wire 71 and the second wire 72 are shielded from signal coupling.

Figure 7B:
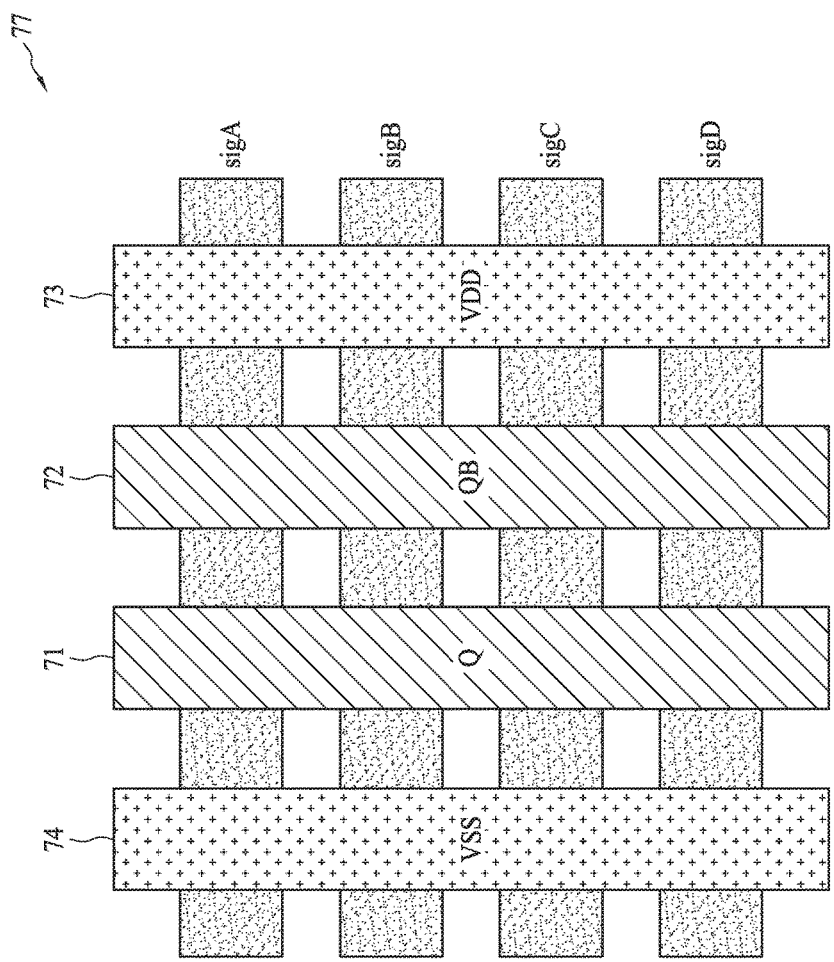
FIG. 7B is a schematic diagram of an exemplary layout according to a partial-shielding mechanism.

FIG. 7B is a schematic diagram of an exemplary layout 77 according to a partial-shielding mechanism.

Referring to FIG. 7B, in the layout 77, the first wire 71 and the second wire 72 are arranged between a pair of power rails 73 and 74 disposed on the same layer as the first and second wires 71 and 72. Unlike the full-shielding mechanism, the first wire 71 and the second wire 72 may be arranged over (as illustrated in the present embodiment) or under (not shown) signal transmission lines sigA, sigB, sigC and sigD disposed at a different layer from the first and second wires 71 and 72. In the partial-shielding mechanism, the first wire 71 and the second wire 72 are partially shielded by the power rails 73 and 74 from signal coupling. However, the partial-shielding mechanism facilitates planning of routing resources.

Figure 8:
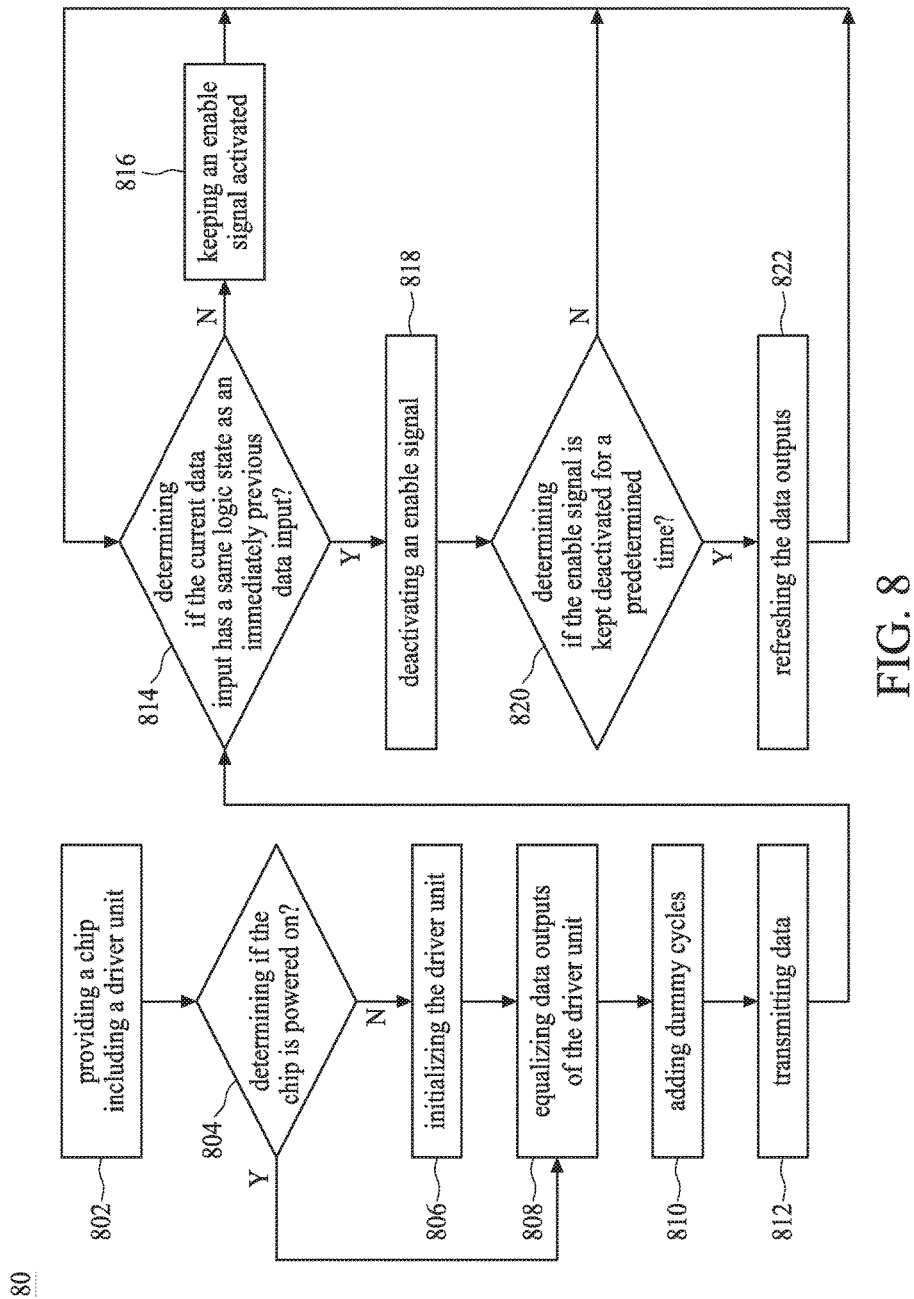
FIG. 8 is a flow diagram showing a method of operating the circuit illustrated in FIG. 1, in accordance with some embodiments.

FIG. 8 is a flow diagram showing a method 80 of operating the circuit illustrated in FIG. 1, in accordance with some embodiments.

Referring to FIG. 8, in operation 802, a chip designed with a circuit 10 is provided. The circuit 10 includes a first driver unit 111 and a second driver unit 12.

In operation 804, it is determined if the chip is powered on. If not, the chip is powered on and in operation 806 the driver unit in the circuit is initialized by, as previously discussed with reference to FIG. 2, driving the first output Q and the second output QB to, for example, VSS and VDD, respectively. If affirmative, which means that the chip is already powered on, then in operation 808 the outputs Q and QB are equalized to approximately ½ VDD. Moreover, after the initialization in operation 806, the equalization process in operation 808 is performed.

Next, in operation 810, dummy cycles are added to the data input IN. The output signals Q and QB alternate with each other with respect to ½ VDD in a relatively small swing.

In operation 812, data IN is transmitted.

In operation 814, it is determined if the current data input has a same logic state as an immediately previous data input. If not, the enable signal EN is kept at an activated state in operation 816, and then the operation 814 is repeated. If affirmative, to save power consumption, the enable signal EN is deactivated in operation 818.

Next, in operation 820, it is determined if the enable signal EN is kept deactivated for a predetermined period of time, for example, a predetermined number of cycles. If affirmative, then in operation 822 the data outputs Q and QB are refreshed to prevent the data outputs Q and QB from floating or corruption. The refresh can be done by driving the data input IN to an inverted state followed by its original state. If in operation 820 the enable signal EN is found activated, the operation 814 is repeated.

In some embodiments, the present disclosure also provides a circuit that includes a first driver unit and a second driver unit. The first driver unit is configured to generate a first output signal in response to a data signal and an enable signal, and drive the first output signal towards a power supply voltage, or towards a reference voltage, or hold the first output signal at a previous voltage level. The second driver unit is configured to generate a second output signal in response to the data signal and the enable signal, and drive the second output signal towards the power supply voltage, or towards the reference voltage, or hold the second output signal at a previous voltage level. The first output signal and the second output signal are complementary to each other.

In some embodiments, the present disclosure provides a method that includes providing a chip including a first driver unit and a second driver unit, wherein the first driver unit and the second driver unit are configured to generate a first output signal and a second output signal, respectively, in response to a data signal and an enable signal, transmitting data through the first driver unit and the second driver unit during a data transmission phase, determining that the data signal received at a first cycle has a same logic state as the data signal received at a second cycle immediately following the first cycle, and deactivating the enable signal.

In some embodiments, the present disclosure provides a driver unit that includes a NAND gate including a first input to receive the data signal, and a second input to receive the enable signal, a p-type transistor including a gate connected to an output of the NAND gate, a NOR gate including a first input to receive the enable signal via an inverter, and a second input to receive the data signal, and an n-type transistor including a gate connected to an output of the NOR gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a first driver unit configured to generate a first output signal at a first output node in response to a data signal and an enable signal, the first driver unit driving the first output signal towards a power supply voltage, or towards a reference voltage, or holding the first output signal at a previous voltage level;
    a second driver unit configured to generate a second output signal at a second output node in response to the data signal and the enable signal, the second driver unit driving the second output signal towards the power supply voltage, or towards the reference voltage, or holding the second output signal at a previous voltage level, the first output signal and the second output signal being complementary to each other; and
    an equalizer connected between the first output node and the second output node, the equalizer configured to, before the data signal is output in a data transmission phase, equalize the first output signal at the first output node and the second output signal at the second output node towards a voltage level between the power supply voltage and the reference voltage in an equalization phase;
    during a dummy phase between the equalization phase and the data transmission phase, the first driver unit further configured to drive the first output signal repeatedly and alternately up and down the voltage level, while the second driver unit further configured to drive the second output signal repeatedly and alternately down and up the voltage level.

2. The circuit according to claim 1 further comprising:
    an amplifier including a first input and a second input, the first input configured to receive the first output signal via a first wire coupled to the first output node, and the second input configured to receive the second output signal via a second wire coupled to the second output node.

3. The circuit according to claim 1, wherein the voltage level equals to half of the power supply voltage.

4. The circuit according to claim 2, wherein the first wire and the second wire are arranged between a pair of power rails disposed on the same layer as the first wire and the second wire.

5. The circuit according to claim 4, wherein the first wire and the second wire are arranged over or under at least another pair of power rails.

6. The circuit according to claim 1, wherein the first driver unit includes:
    a NAND gate including a first input to receive the data signal, and a second input to receive the enable signal;
    a p-type transistor including a gate connected to an output of the NAND gate;
    a NOR gate including a first input to receive the enable signal via an inverter, and a second input to receive the data signal; and
    an n-type transistor including a gate connected to an output of the NOR gate, the p-type transistor and the n-type transistor being cascode connected between the power supply voltage and the reference voltage.

7. The circuit according to claim 1, wherein the second driver unit includes:
    a NAND gate including a first input to receive the data signal via a first inverter, and a second input to receive the enable signal;
    a p-type transistor including a gate connected to an output of the NAND gate;
    a NOR gate including a first input to receive the enable signal via a second inverter, and a second input to receive the data signal via the first inverter; and
    an n-type transistor including a gate connected to an output of the NOR gate, the p-type transistor and the n-type transistor being cascode connected between the power supply voltage and the reference voltage.

8. The circuit according to claim 1 further comprising:
    a trimming circuit configured to trim voltage deviation in at least one of the first driver unit or the second driver unit due to process variation, the trimming circuit including an AND gate.

9. The circuit according to claim 1 further comprising:
    a control circuit configured to disable the enable signal during the data transmission phase.

10. The circuit according to claim 9, wherein the control circuit includes:
    a d-type flip flop including a data input port to receive the data signal;
    an exclusive-or gate including a first input to receive the data signal, and a second input connected to a data output port of the d-type flip flop; and
    an AND gate including a first input to receive an input enable signal, and a second input connected to an output of the exclusive-or gate.

11. A method, comprising:
    providing a chip including a first driver unit and a second driver unit, the first driver unit and the second driver unit being configured to generate a first output signal and a second output signal, respectively, in response to a data signal and an enable signal;
    transmitting data through the first driver unit and the second driver unit during a data transmission phase; and
    A determining whether to deactivate the enable signal by determining the data signal received at a first cycle has a same logic state as the data signal received at a second cycle immediately following the first cycle;
    wherein before the data is transmitted through the first driver unit and the second driver unit during the data transmission phase, the method further comprises:
    equalizing the first output signal and the second output signal towards a voltage level between a power supply voltage and a reference voltage in an equalization phase; and
    during a dummy phase between the equalization phase and the data transmission phase, driving the first output signal repeatedly and alternately up and down the voltage level, while driving the second output signal repeatedly and alternately down and up the voltage level.

12. The method according to claim 11, wherein the determining comprises:
when it is determined that the data signal received at the first cycle has a different logic state as the data signal received at the second cycle immediately following the first cycle, keeping the enable signal at an activated state; and
when it is determined that the data signal received at the first cycle has the same logic state as the data signal received at the second cycle immediately following the first cycle, deactivating the enable signal.

13. The method according to claim 12, after deactivating the enable signal, further comprising:
when it is determined that the enable signal has been kept deactivated for a predetermined number of cycles, refreshing the first output signal and the second output signal.

14. The method according to claim 13, wherein the refreshing comprises:
sending a data signal having a logic state different from an original logic state of the data signal currently transmitted; and
resuming transmission of the data signal having the original logic state.

15. The method according to claim 14, wherein the refreshing comprises:
activating the enable signal while sending the data signal having the logic state different from the original logic state of the data signal currently transmitted; and
deactivating the enable signal while resuming the transmission of the data signal having the original logic state.

16. The method according to claim 11, before transmitting the data, further comprising:
driving the first output signal to one of the power supply voltage and the reference voltage; and
driving the second output signal to the other one of the power supply voltage and the reference voltage.

17. The method according to claim 11, wherein the voltage level equals to half of the power supply voltage.

* * * * *